United States Patent
Tsuchiya et al.

(10) Patent No.: US 9,948,064 B2
(45) Date of Patent: Apr. 17, 2018

(54) METHOD OF MANUFACTURING SEMICONDUCTOR DEVICE, AND SEMICONDUCTOR DEVICE

(71) Applicant: Mitsubishi Electric Corporation, Tokyo (JP)

(72) Inventors: Hiroaki Tsuchiya, Tokyo (JP); Harunaka Yamaguchi, Tokyo (JP); Eiji Nakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/404,428

(22) Filed: Jan. 12, 2017

(65) Prior Publication Data

US 2017/0365981 A1 Dec. 21, 2017

(30) Foreign Application Priority Data

Jun. 16, 2016 (JP) ................. 2016-120151

(51) Int. Cl.
*H01S 5/227* (2006.01)
*H01S 5/22* (2006.01)

(52) U.S. Cl.
CPC ............ *H01S 5/227* (2013.01); *H01S 5/2206* (2013.01); *H01S 5/2226* (2013.01)

(58) Field of Classification Search
CPC ....... H01S 5/227; H01S 5/2226; H01S 5/2206
See application file for complete search history.

(56) References Cited

U.S. PATENT DOCUMENTS

| 4,849,372 A | 7/1989 | Takemoto | |
| 5,452,315 A * | 9/1995 | Kimura | H01S 5/227 |
| | | | 372/46.01 |
| 5,486,490 A * | 1/1996 | Kakimoto | H01S 5/16 |
| | | | 438/33 |
| 2002/0042155 A1 * | 4/2002 | Sakata | H01S 5/227 |
| | | | 438/22 |

FOREIGN PATENT DOCUMENTS

JP Sho63-202985 A 8/1988

* cited by examiner

*Primary Examiner* — Dung Nguyen
(74) *Attorney, Agent, or Firm* — Studebaker & Brackett PC

(57) ABSTRACT

A method of manufacturing a semiconductor device includes a step of forming a mesa portion including an active layer above a substrate, and an n-type layer above the active layer, a step of forming a current confinement portion on left and right of the mesa portion, the current confinement portion including a p-type current blocking layer, an n-type current blocking layer above the p-type current blocking layer, and an i-type or p-type current blocking layer above the n-type current blocking layer, and a p-type doping step of diffusing p-type impurities into the i-type or p-type current blocking layer, an upper portion of the n-type current blocking layer, and left and right portions of the n-type layer to change the upper portion of the n-type current blocking layer and the left and right portions of the n-type layer to p-type semiconductors.

3 Claims, 3 Drawing Sheets

METHOD OF MANUFACTURING SEMICONDUCTOR DEVICE, AND SEMICONDUCTOR DEVICE

BACKGROUND OF THE INVENTION

Field of the Invention

The present invention relates to a method of manufacturing a semiconductor device for use in, for example, optical communication or the like, and a semiconductor device manufactured by the manufacturing method.

Background Art

Communication lasers include a current confinement layer having a thyristor structure. This current confinement layer may be called a BH structure or a current blocking layer. Forming the current confinement layer should not cause an n-type cladding layer and an n-type region of the current confinement layer to be connected to each other. The connection between the n-type cladding layer and the n-type region of the current confinement layer is referred to as "n-connection." Measures to reduce n-connection include the optimization of the impurity concentration within the current confinement layer and the introduction of etching gas during growth for controlling the shape of the current confinement layer.

Japanese laid-open patent publication No. S63-202985 discloses a technique that diffuses a high concentration of impurities contained in a p-type current blocking layer into an n-type current blocking layer to invert a portion of the n-type current blocking layer which is near a mesa portion to p-type.

In the case where a current confinement layer is not sufficiently etched during growth or where abnormal crystal growth occurs near a mesa portion or a selective growth mask, "n-connection" may occur. In the case where etching gas is introduced while a current confinement layer is being formed, n-connection may not be reliably eliminated due to variations in the amount of etching gas introduced or the occurrence of a portion which is difficult to etch. Moreover, in the case where the p-type impurity concentration of the current blocking layer is increased, p-type impurities are diffused into an active layer to deteriorate device characteristics or diffused into an n-type current blocking layer to impair current leakage reduction effect. No method for reducing n-connection without adverse effects has been found.

SUMMARY OF THE INVENTION

The present invention has been accomplished to solve the above-described problems. An object of the present invention is to provide a semiconductor device manufacturing method which can reduce n-connection without adverse effects and a semiconductor device manufactured by the method.

The features and advantages of the present invention may be summarized as follows.

According to one aspect of the present invention, a method of manufacturing a semiconductor device includes a mesa portion formation step of forming a mesa portion above a substrate, the mesa portion including a p-type layer, an active layer above the p-type layer, and an n-type layer above the active layer, a current confinement portion formation step of forming a current confinement portion on left and right of the mesa portion, the current confinement portion including a p-type current blocking layer, an n-type current blocking layer above the p-type current blocking layer, and an i-type or p-type current blocking layer above the n-type current blocking layer, and a p-type doping step of diffusing p-type impurities in a vapor or solid phase into the i-type or p-type current blocking layer, an upper portion of the n-type current blocking layer, and left and right portions of the n-type layer to change the upper portion of the n-type current blocking layer and the left and right portions of the n-type layer to p-type semiconductors.

According to another aspect of the present invention, a semiconductor device includes a substrate, a mesa portion including a p-type layer formed above the substrate, an active layer formed above the p-type layer, and an n-type layer formed above the active layer, and a current confinement portion including a p-type current blocking layer and an n-type current blocking layer on left and right of the mesa portion, wherein the n-type layer is smaller in width than the active layer.

Other and further objects, features and advantages of the invention will appear more fully from the following description.

DETAILED DESCRIPTION OF THE PREFERRED EMBODIMENT

Semiconductor device manufacturing methods and semiconductor devices according to embodiments of the present invention will be described with reference to the drawings. The same or corresponding components will be denoted by the same reference signs, and the repetition of explanation thereof may be omitted.

Embodiment

Figure 1:
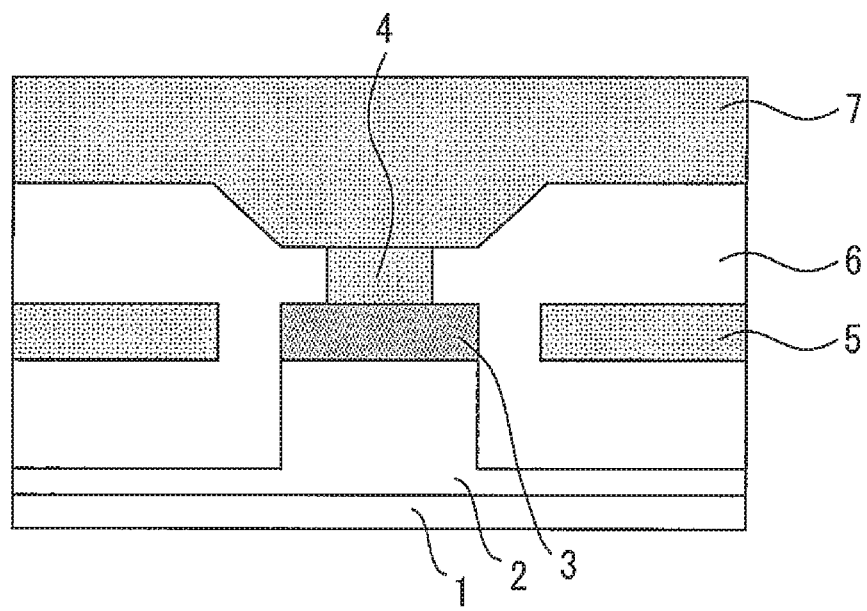
FIG. 1 is a cross-sectional view of a semiconductor device according to an embodiment.

FIG. 1 is a cross-sectional view of a semiconductor device according to an embodiment. This semiconductor device is a semiconductor laser diode including a mesa portion and a current confinement portion which are formed on a substrate 1 made of Zn-doped p-type InP, the mesa portion being buried in the current confinement portion. The mesa portion includes a p-type layer 2 formed above the substrate 1, an active layer 3 formed above the p-type layer 2, and an n-type layer 4 formed above the active layer 3. The mesa portion provides a ridge waveguide.

The p-type layer 2 is, for example, a p-type cladding layer, and may include a buffer layer, a light guide layer, or the like. The n-type layer 4 is, for example, an n-type cladding layer, and may include a buffer layer, a light guide layer, or the like. The n-type layer 4 is smaller in width than the active layer 3. The width of the n-type layer 4 is smaller than the width of the active layer 3 by, for example, 100 nm or more.

The current confinement portion includes a p-type current blocking layer 6 and an n-type current blocking layer 5 on the left and right of the mesa portion. The p-type current blocking layer 6 touches the mesa portion, but the n-type current blocking layer 5 does not touch the mesa portion. Regions between the n-type current blocking layer 5 and the mesa portion are filled with the p-type current blocking layer 6. A contact layer 7 is formed on the mesa portion and the current confinement portion.

A semiconductor device manufacturing method according to the embodiment of the present invention will be described with reference to FIGS. 2 to 6. Semiconductor layers of the semiconductor device can be formed by metalorganic vapor phase epitaxy, molecular beam epitaxy, or the like.

1. Mesa Portion Formation Step

Figure 2:
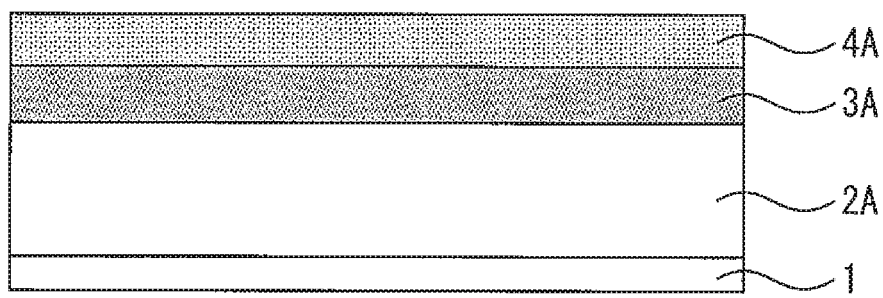
FIG. 2 shows that a p-type layer, an active layer, and an n-type layer are sequentially formed.

First, a structure shown in FIG. 2 is fabricated. Specifically, a p-type layer 2A, an active layer 3A, and an n-type layer 4A are sequentially formed on a substrate 1 by metalorganic vapor phase epitaxy. The p-type layer 2A is formed, for example, at a growth temperature of 550 to 700° C. to a thickness of 0.5 to 2.0 μm such that the carrier concentration becomes 0.05 to 2.5E18 $cm^{-3}$. The p-type layer 2A is, for example, a Zn-doped p-type InP cladding layer.

The active layer 3A is, for example, an InGaAsP layer having a thickness of 0.05 to 0.2 μm. The n-type layer 4A is, for example, a S-doped n-type InP cladding layer having a thickness of 0.5 to 2 μm. The carrier concentration of the n-type layer 4A is, for example, 0.05 to 5.0818 $cm^{-3}$.

Figure 3:
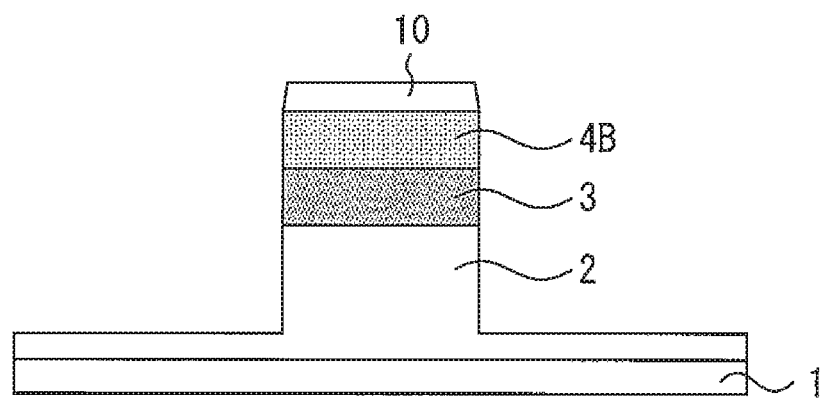
FIG. 3 shows mesa portion.

Subsequently, a mesa portion shown in FIG. 3 is formed by etching. At the beginning of the formation of the mesa portion, a $SiO_2$ mask 10 is formed on the n-type layer 4A using a sputtering system. Then, etching is performed using an ICP system until the substrate 1 is exposed, thus forming a mesa portion having a height of 1.5 to 4.0 μm. The mesa portion includes a p-type layer 2 above the substrate 1, an active layer 3 above the p-type layer 2, and an n-type layer 4B above the active layer 3. The step of forming the mesa portion is referred to as a mesa portion formation step.

2. Current Confinement Portion Formation Step

Figure 4:
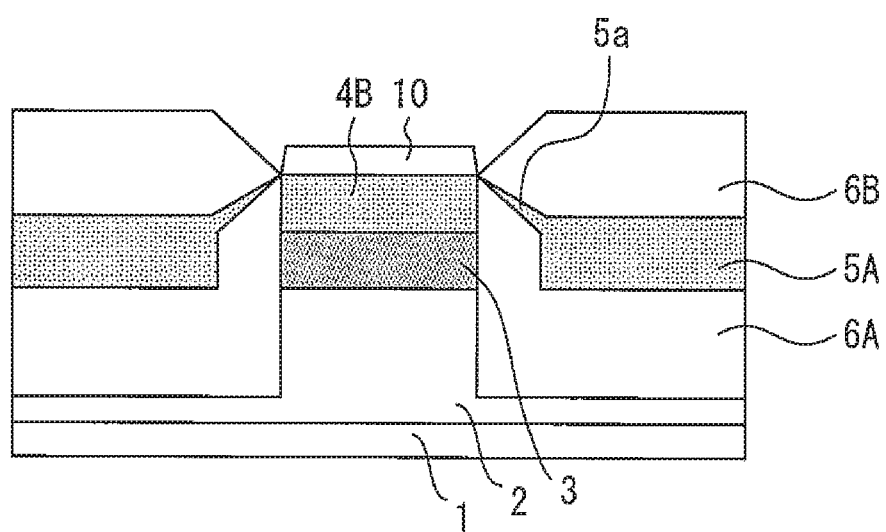
FIG. 4 shows current confinement portion.

Subsequently, a current confinement portion shown in FIG. 4 is formed. In this step, a current confinement portion including a p-type current blocking layer 6A, an n-type current blocking layer 5A above the p-type current blocking layer 6A, and an i-type current blocking layer 6B above the n-type current blocking layer 5A is formed on the left and right of the mesa portion by metalorganic vapor phase epitaxy. The growth temperature is, for example, approximately 550 to 700° C. It should be noted that i-type means undoped.

The p-type current blocking layer 6A is, for example, a Zn-doped p-type InP layer having a thickness of 0.1 to 0.5 μm and having a carrier concentration set to 0.5 to 2.0E18 $cm^{-3}$. The n-type current blocking layer 5A is, for example, a S-doped n-type InP layer having a thickness of 0.5 to 2.0 μm and having a carrier concentration set to 5.0 to 10.0E18 $cm^{-3}$. The i-type current blocking layer 6B is, for example, an i-InP layer having a thickness of 0.5 to 2.0 μm. The step of forming the current confinement portion in this way is referred to as a current confinement portion formation step. It should be noted that instead of the i-type current blocking layer 6B, a layer doped with a p-type dopant may be formed.

Immediately after the current confinement portion formation step, the n-type current blocking layer 5A includes thin extensions 5a as shown in FIG. 4. These extensions 5a are unnecessary portions formed near the mesa portion. The extensions 5a connect the n-type current blocking layer 5A and the n-type layer 4B. Such a phenomenon is referred to as "n-connection."

3. P-Type Doping Step

Figure 5:
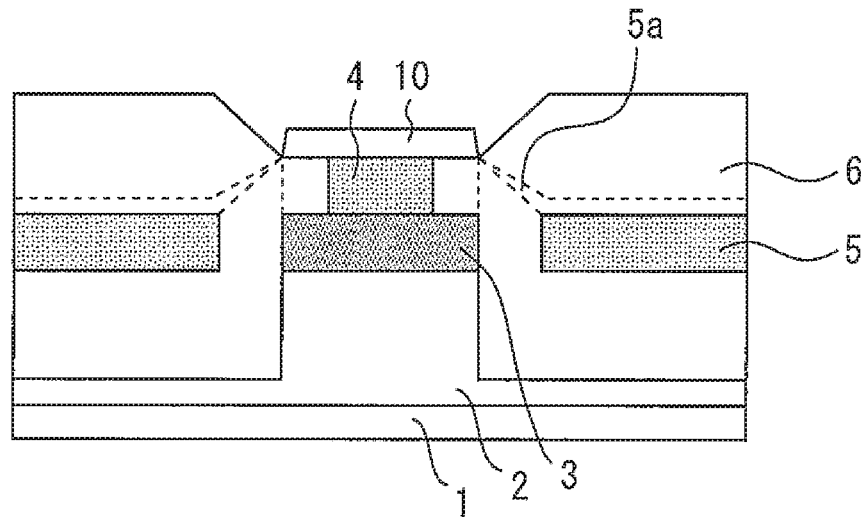
FIG. 5 shows a cross-sectional view of the semiconductor device after the p-type doping step.

Subsequently, p-type impurities such as Zn are diffused in a vapor phase by a metalorganic vapor phase epitaxy system to change the i-type current blocking layer 6B, an upper portion of the n-type current blocking layer 5A, and left and right portions of the n-type layer 4B to p-type semiconductors. More specifically, p-type impurities are diffused in a vapor phase into the i-type current blocking layer 68B, the upper portion of the n-type current blocking layer 5A, and the left and right portions of the n-type layer 4B to change at least the upper portion of the n-type current blocking layer 5A and the left and right portions of the n-type layer 4B to p-type semiconductors. This step is referred to as a p-type doping step. FIG. 5 shows a cross-sectional view of the semiconductor device after the p-type doping step. The upper portion of the n-type current blocking layer 5A is doped p-type, and the portion doped p-type is indicated by broken lines in FIG. 5. The left and right portions of the n-type layer 4B are doped p-type, and the portions doped p-type are indicated by broken lines in FIG. 5. The p-type doping step dopes the extensions 5a in FIG. 4 p-type to eliminate "n-connection." Moreover, since the left and right portions of the n-type layer 4B are doped p-type, the width of the n-type layer 4 becomes smaller than the width of the active layer 3.

In the p-type doping step, p-type impurities may be diffused by solid phase diffusion instead of vapor phase diffusion. In the case of solid phase diffusion, a film serving as a source of diffusion of p-type impurities is formed on the current confinement portion, and p-type impurities are diffused in a solid phase. The film serving as the source of diffusion is an oxide film such as ZnO.

4. Contact Layer Formation Step

Figure 6:
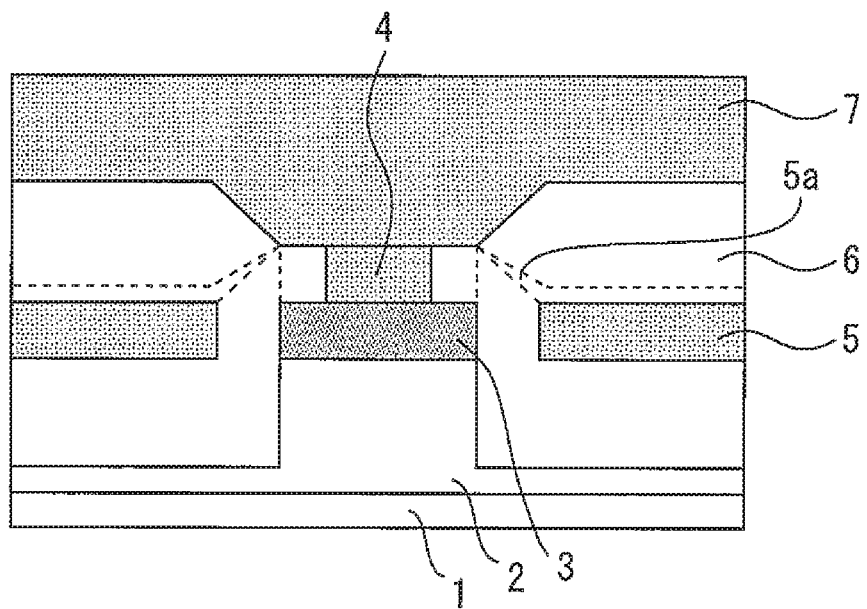
FIG. 6 shows a contact layer formed on the mesa portion and the current confinement portion.

Subsequently, the $SiO_2$ mask 10 is removed, and a contact layer is formed by metalorganic vapor phase epitaxy. FIG. 6 shows a contact layer 7 formed on the mesa portion and the current confinement portion. The contact layer 7 is, for example, a S-doped n-type InP layer formed at a growth temperature of 550 to 700° C. such that the concentration of S as carriers becomes 1.0 to 15.0E18 $cm^{-3}$. The thickness of the contact layer 7 is, for example, 1.0 to 3.0 μm.

Performing the above-described steps completes the semiconductor device shown in FIG. 1. In the semiconductor device manufacturing method according to the embodiment of the present invention, the extensions Sa in FIG. 4 are doped p-type in the p-type doping step to reduce "n-connection." This eliminates n-connection.

Another possible way to eliminate n-connection is to introduce etching gas such as HCl so that the extensions 5a may be removed at a stage after the structure in FIG. 4 is formed or a stage after the n-type current blocking layer 5A is formed. However, variations in the amount of etching gas introduced and surface roughness caused by the processing of the mesa produce a growth face difficult to etch, and this may prevent n-connection from being eliminated. Moreover, in the case where etching gas causes damage to the $SiO_2$ mask 10, problems such as abnormal growth of the current confinement layer occur.

Yet another possible way is to dope the p-type current blocking layer 6A or the i-type current blocking layer 6B in FIG. 4 with p-type impurities having a concentration sufficiently higher than the impurity concentration of the n-type current blocking layer 5A. In this case, it is expected that the diffusion of the p-type impurities of the p-type current blocking layer 6A or the i-type current blocking layer 6B into the n-type current blocking layer 5A eliminates the extensions 5a. However, in this case, the p-type impurities of the p-type current blocking layer 6A or the i-type current blocking layer 6B may be diffused into the active layer 3 due to heat applied in the next step, i.e., a contact layer formation step, to lower the laser emission efficiency. Moreover, in the case where the p-type impurity concentration of the p-type current blocking layer 6A or the i-type current blocking layer 6B is sufficiently higher than the impurity concentration of the n-type current blocking layer 5A, n-type carriers of the n-type current blocking layer 5A are compensated, and the current leakage reduction effect of the current confinement portion is impaired.

In contrast, the semiconductor device manufacturing method according to the embodiment of the present invention eliminates n-connection by the vapor phase diffusion or solid phase diffusion of p-type impurities, and therefore does not have adverse effects which would be produced in the case where the extensions 5a are removed using etching gas. Moreover, since the p-type impurity concentration of the p-type current blocking layer 6A or the i-type current blocking layer 6B does not need to be sufficiently higher than the impurity concentration of the n-type current blocking layer 5A, the laser emission efficiency is not reduced, and the current leakage reduction effect is not damaged.

As described above, the semiconductor device manufacturing method according to the embodiment of the present invention can reduce n-connection without adverse effects. Further, since the p-type doping step dopes the left and right portions of the n-type layer 4B p-type, the effect of improving the current confinement effect can be obtained.

The semiconductor device manufacturing method according to the embodiment of the present invention can be variously modified within a range in which features thereof are not lost. For example, the $SiO_2$ film may be formed using an oxide film formation apparatus by thermal CVD or the like, and the mesa portion may be formed by dry etching using an RIE system or wet etching using a liquid chemical. The impurity diffusion of Zn in the p-type doping step may be performed using a thermal diffusion furnace or performed by solid phase diffusion.

In the present invention, n-connection is eliminated by diffusing p-type impurities in a vapor or solid phase. Accordingly, n-connection can be reduced without adverse effects.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor device, comprising:
    a mesa portion formation step of forming a mesa portion above a substrate, the mesa portion including a p-type layer, an active layer above the p-type layer, and an n-type layer above the active layer,
    a current confinement portion formation step of forming a current confinement portion on left and right of the mesa portion, the current confinement portion including a p-type current blocking layer, an n-type current blocking layer above the p-type current blocking layer, and an i-type or p-type current blocking layer above the n-type current blocking layer, and
    a p-type doping step of diffusing p-type impurities in a vapor or solid phase into the i-type or p-type current blocking layer, an upper portion of the n-type current blocking layer, and left and right portions of the n-type layer to change the upper portion of the n-type current blocking layer and the left and right portions of the n-type layer to p-type semiconductors.

2. The method according to claim 1, wherein
    the substrate comprises InP,
    the p-type layer comprises Zn-doped InP,
    the n-type layer comprises S-doped InP,
    the p-type current blocking layer comprises Zn-doped InP,
    the n-type current blocking layer comprises S-doped InP, and
    the p-type impurities are Zn.

3. The method according to claim 1, wherein
    in the p-type doping step, a film serving as a source of diffusion of the p-type impurities is formed on the current confinement portion, and the p-type impurities are diffused in a solid phase.

* * * * *